(12) United States Patent
Esteve et al.

(10) Patent No.: US 9,414,509 B2
(45) Date of Patent: Aug. 9, 2016

(54) ELECTRONIC BOX, PARTICULARLY FOR INTERNET ACCESS AND/OR FOR VIDEO DECODING

(71) Applicant: THOMSON LICENSING, Issy de Moulineaux (FR)

(72) Inventors: Bruno Esteve, Paris (FR); Vincent Mallet, Paris (FR); Sebastien Weber, Plaisir (FR)

(73) Assignee: Thomson Licensing (FR)

( * ) Notice: Subject to any disclaimer, the term of this patent is extended or adjusted under 35 U.S.C. 154(b) by 286 days.

(21) Appl. No.: 14/103,913

(22) Filed: Dec. 12, 2013

(65) Prior Publication Data

US 2014/0174817 A1    Jun. 26, 2014

(30) Foreign Application Priority Data

Dec. 12, 2012    (FR) ..................... 12 61965

(51) Int. Cl.
| | | |
|---|---|---|
| *H05K 7/02* | (2006.01) | |
| *H05K 5/02* | (2006.01) | |
| *G06F 1/18* | (2006.01) | |

(52) U.S. Cl.
CPC .............. *H05K 5/0247* (2013.01); *G06F 1/181* (2013.01); *H05K 5/0208* (2013.01)

(58) Field of Classification Search
CPC ........... H02G 3/08; H02G 3/081; H02G 3/10; H02G 3/14; H02G 3/30; H05K 5/00; H05K 5/02; H05K 5/0247; H05K 5/03; H05K 5/0269; H05K 7/186; H05K 5/0208; G02B 6/4452; G06F 1/16; G06F 1/18; G06F 1/181; E05B 65/00
USPC ............... 174/50, 520, 559, 66, 67, 541, 480, 174/481, 58, 59; 220/3.2, 3.3, 4.02; 361/600, 601, 679.01, 679.02, 724, 361/730, 752; 385/134, 135; 312/223.1, 312/223.2, 223.6

See application file for complete search history.

(56) References Cited

U.S. PATENT DOCUMENTS 5,482,232 A    1/1996 Wynn et al.
5,823,646 A *  10/1998 Arizpe .................... E06B 5/006
                                                          312/223.1

(Continued)

FOREIGN PATENT DOCUMENTS

| DE | 9404470 | 5/1994 |
|---|---|---|
| FR | 2805357 | 8/2001 |

(Continued)

OTHER PUBLICATIONS

Search Rept:May 29, 2013.

*Primary Examiner* — Angel R Estrada
(74) *Attorney, Agent, or Firm* — Jack Schwartz & Associates, PLLC

(57) ABSTRACT

According to the invention, the electronic box comprising a main connection zone defined on one of its walls and in which is arranged at least one main connector designed to receive an external connection cable, is wherein it comprises:
  an attachment zone separate from the main connection zone and defined on another wall of said box, in which means for attaching a box to an external support are able to be arranged, and
  a moving part configured to occupy at least:
    a closed position in which the main connection zone and the attachment zone are simultaneously covered to prevent access to said attachment means and to said external connection cable, once the latter respectively are fitted and connected,
    an open position in which the main connection zone and the attachment zone are accessible.

11 Claims, 4 Drawing Sheets

(56) References Cited

U.S. PATENT DOCUMENTS

| | | | | |
|---|---|---|---|---|
| 6,443,322 B1 * | 9/2002 | Braun | ............ | H05K 7/186 174/50 |
| 7,443,661 B2 | 10/2008 | Xu et al. | | |
| 7,760,984 B2 * | 7/2010 | Solheid | ............ | G02B 6/4452 385/135 |
| 8,139,914 B2 * | 3/2012 | Lee | ............ | G02B 6/4452 385/135 |
| 8,993,886 B2 * | 3/2015 | Le | ............ | H05K 5/03 174/50 |
| 2013/0228368 A1 * | 9/2013 | Declerck | ............ | H02G 3/30 174/481 |

FOREIGN PATENT DOCUMENTS

| | | |
|---|---|---|
| JP | 2005182454 | 7/2005 |
| JP | 2008240439 | 10/2008 |
| WO | WO2011017486 | 2/2011 |

* cited by examiner

ELECTRONIC BOX, PARTICULARLY FOR INTERNET ACCESS AND/OR FOR VIDEO DECODING

This application claims the benefit, under 35 U.S.C. §119 of French Patent Application No. 1261965, filed Dec. 12, 2012.

The present invention relates to electronic boxes and particularly, but not exclusively, to Internet access boxes (also known as gateways), as well as video decoding boxes (also known as set-top boxes).

In particular and although not exclusively, the invention is particularly well adapted to the aforementioned electronic boxes being in the shape of a rectangular parallelepiped.

It is known that Internet boxes and/or decoder generally comprise several connectors designed to co-operate with connection cables of different types (for example Ethernet, HDMI, USB, RJ11, etc.), as well as with external devices (for example a USB key), either directly or by means of an appropriate connection cable.

Further, and in a known manner, the connector of the Internet boxes and/or decoder are generally arranged next to each other, preferably on their rear face, and remain continuously accessible to the final user.

However, an Internet Access Provider may need to prohibit access to a main connection zone of an Internet box (that it supplies) comprising one or more main connectors—so that a final user cannot connect and/or disconnect the cables or associated devices without its permission or without the action of a mandated operator—while maintaining access by the final user to the other connectors of the box, whether the latter are adjacent or distant from said main connectors.

An access provider may also want to lock out access to other zones of the Internet box separate from the main connection zone and without connectors, but comprising elements for which the access provider wants to control access (such as attachment screws for example).

The purpose of this invention is notably to resolve the access problem mentioned above, particularly in the case where the box has a reduced size.

For this purpose, according to the invention, the electronic box, for example of parallelepipedic shape, comprising a main connection zone defined on one of its walls and in which is arranged at least one main connector designed to receive an external connection cable, is remarkable in that it comprises:
  an attachment zone separate from the main connection zone and defined on another wall of said box, in which means for attaching the box to an external support are able to be arranged, and
  a part moving in relation to the walls of the box configured to occupy at least one of following two positions:
    a closed position in which the main connection zone and the attachment zone are simultaneously covered to prevent access to said attachment means and to said external connection cable, once said attachment means are fitted and said connection cable connected,
    an open position in which the main connection zone and the attachment zone are accessible.

Hence, by means of the present invention, access to the main connection zone and attachment zone of the box can be prohibited simultaneously by placing the moving part in the closed position. In this manner, and controlling the movement of the moving part, it is possible jointly to allow or prohibit access to said main connection and attachment zones.

According to a preferred embodiment in accordance with the present invention, said electronic box comprises an auxiliary connection zone separate from the main connection zone and defined on the same wall as the latter, said auxiliary connection zone remaining accessible irrespective of the position occupied by said moving part.

Hence, the connector or connectors of the auxiliary connection zone can remain accessible to a final user who can carry out the connections and/or disconnections as he wishes, without moving the moving part and independently from its position.

Furthermore, according to this preferred embodiment, said main and auxiliary zones are adjoined.

Moreover, said moving part preferably comprises:
  a flat wall configured to cover, in closed position, the attachment zone, and
  a cover integral with said flat wall configured to cover, in closed position, the main connection zone.

Advantageously, said cover can comprise a wall arranged in a noticeably orthogonal manner to the direction of insertion of the external connection cable into the main connector, when the moving part occupies the closed position, so as to be able to prevent, in this position, the disconnection of said cable.

Said cover preferably comprises a locking system enabling the moving part to be maintained in closed position, once said locking system is locked.

Hence, for an electronic box loaned by a supplier, the latter can prevent access to the attachment means and at least to the main connection cable, by being the only one able to lock and unlock the locking system. As soon as the box has been fixed to an external support and that the locking system has been locked (the moving part being in closed position), the final user cannot dismantle, by himself, the box from said support.

Moreover, said electronic box can comprise at least one main housing into which a corresponding removable main module can be inserted when said moving part occupies the open position, said main module being maintained inside said main housing by said moving part when it occupies the closed position.

Furthermore, said box can also comprise at least one auxiliary housing into which a corresponding removable auxiliary module can be inserted when said moving part occupies the open position, said auxiliary module being maintained inside said auxiliary housing by said main module when said moving part occupies the closed position.

According to an additional characteristic of the present invention, said electronic box can comprise a removable guide designed to orient at least one external connection cable along the wall of said box.

Advantageously, said electronic box can comprise a housing into which one or more external connection cables can be inserted, at least partially.

Said electronic box is an access box for Internet and/or video decoding.

The figures of the annexed drawing will provide a good understanding of how the invention can be implemented. In these figures, identical references designate similar elements.

FIGS. 1 to 5 show, according to an embodiment in accordance with the present invention, an electronic box B (also called gateway) that is notably designed to provide an Internet connection to a professional premise, a dwelling, etc. As these figures show, the electronic box B is in the shape of a rectangular parallelepiped. Naturally, other shapes (for example oval) can also be envisaged.

It will easily be understood that the present invention is in no way limited to an Internet box, but that it can also be applied to a TV decoder box (particularly a set-top box). Moreover, it is clear that the Internet box could have any other shape required and adapted, for example, cubic Thereafter, and by convention, the Internet box B is defined by a depth p, a width l and a length L which extend respectively along directions x, y and z of orthonormal axes (x, y, z) associated with said box B. Moreover, the notions front/back, left/right and top/bottom are defined in relation to the directions x, y and z: the directions of the arrows of the axes (x, y, z) showing, respectively, the passage from back to front, left to right and bottom to top.

Figure 2:
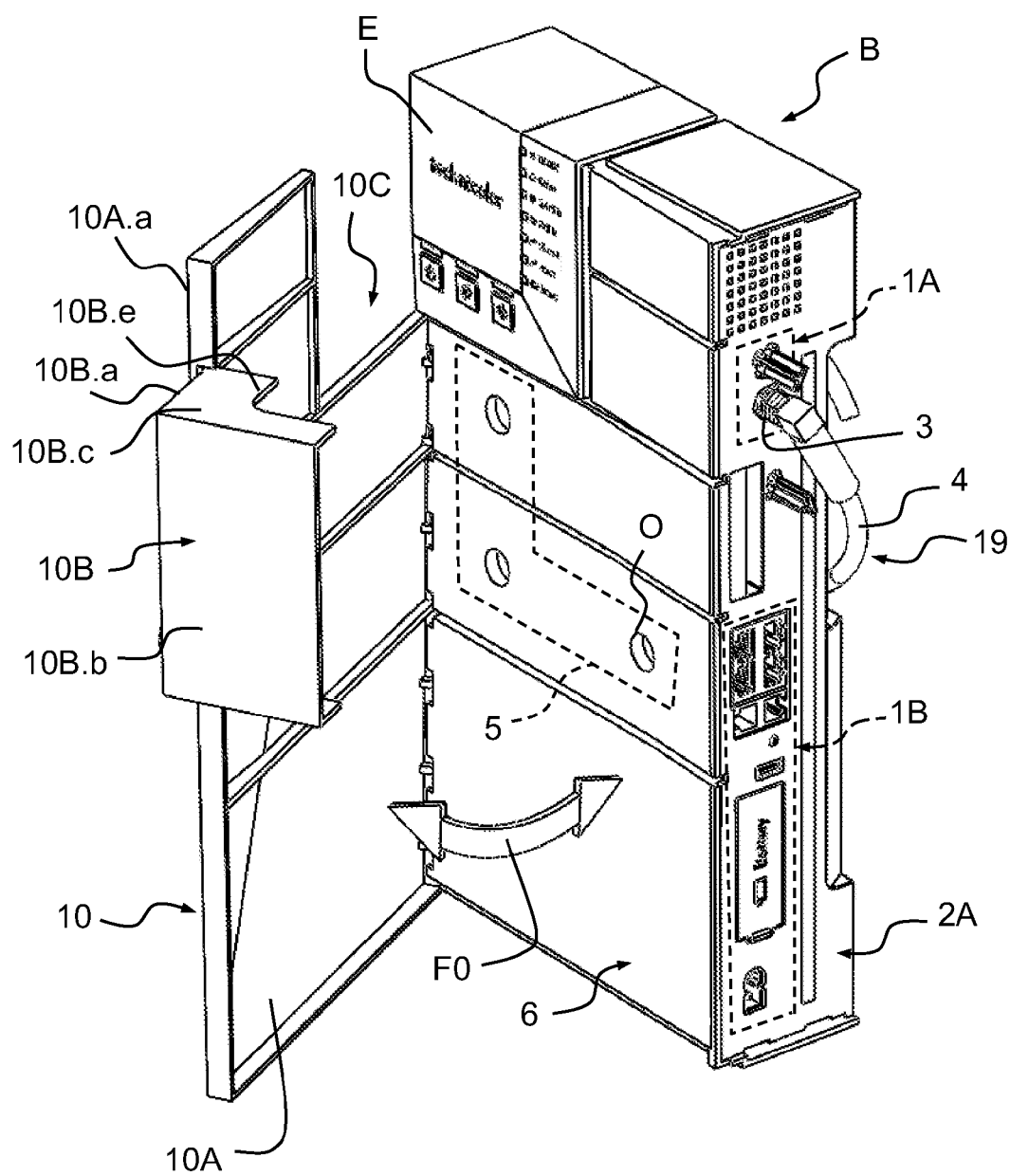
FIG. 2 is a view similar to FIG. 1, in which the cover occupies an open position.
Figure 3:
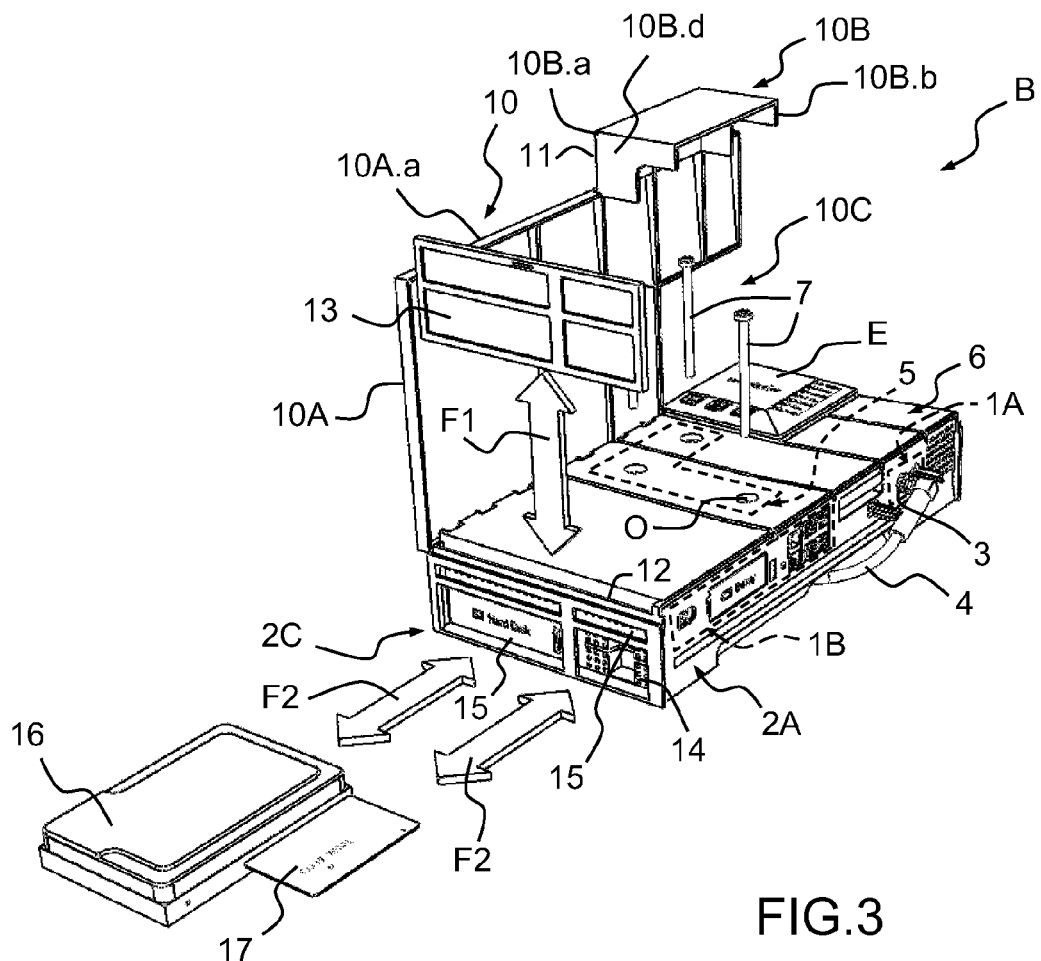
FIG. 3 shows, in a partially exploded diagrammatic view, the Internet box of FIG. 1, the cover being in the open position.
Figure 4:
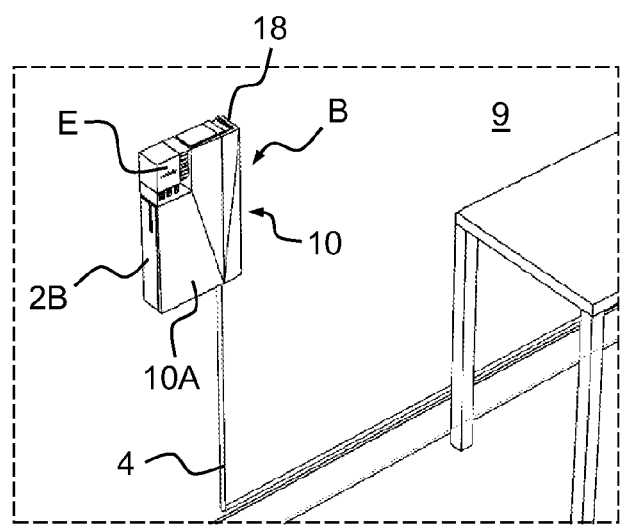
FIG. 4 shows, in a perspective diagrammatic view, the Internet box of FIG. 1, after having been fixed to a wall.
Figure 5:
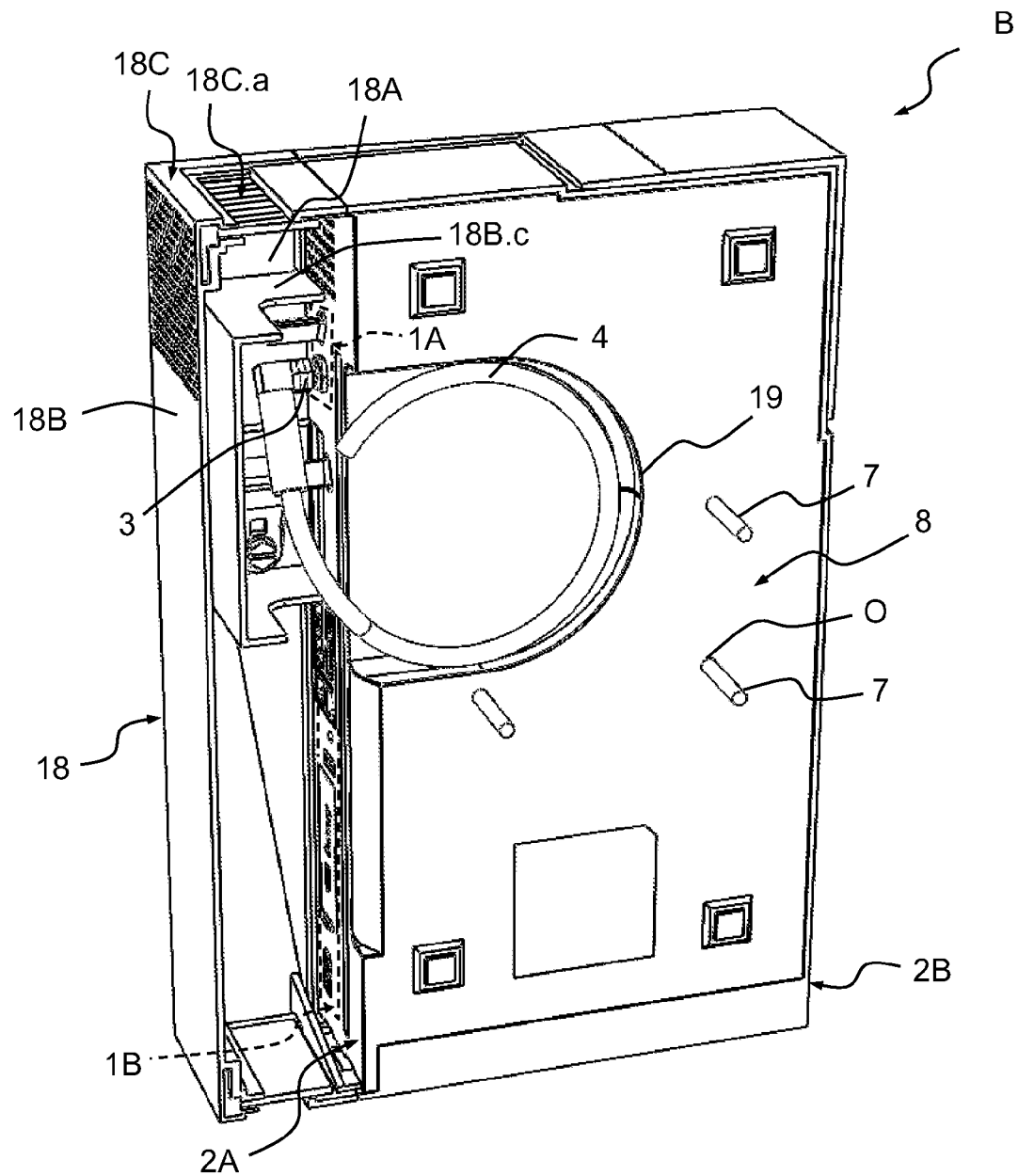
FIG. 5 shows the rear face of the Internet box of FIG. 1, which is designed to be placed against a wall.

In the embodiment, as shown in FIGS. 2 and 3, the Internet box B comprises:

a main connection zone 1A defined on the right-hand lateral wall 2A of the box B and in which is arranged a connector 3 designed to receive a coaxial connection cable 4 for establishing an Internet connection. In the example, only a connector 3 is shown in the main connection zone 1A although, in a variant, this zone can comprise several similar or different connectors, and an attachment zone 5 belonging to the front wall 6 of the box B and comprising two openings O crossing the box B in its thickness p from the front face 6 to finish at the rear face 8 (FIG. 5). Each opening O is able to receive a corresponding attachment screw 7 (FIG. 3) designed to be screwed, for example, into an associated plug (not shown in the figures) fixed in a wall 9 (FIG. 4).

The Internet box B also comprises an auxiliary connection zone 1B arranged on the right-hand lateral face 2A of this one and comprising a plurality of connectors, for example of the type Ethernet, USB, RJ11, etc. as well as a power supply connector. In other words, in the embodiment shown, the main connection zones 1A and 1B are adjacent and located on the same wall of the box B. It will be understood that, in a variant, they can be arranged on different walls of the Internet box B.

From the above, it emerges that the main connection zone 1A and the attachment zone 5 are disjointed and distant, as they are arranged respectively on the right-hand lateral face 2A and the front face 6 of the box B, the angle defined between these faces 2A and 6 being a right angle (equal to) 90°, or noticeably.

According to the invention, as shown by FIGS. 1 to 4, the Internet box B further comprises a moving cover 10 formed by a flat wall 10A and a cover 10B. The cover 10 can occupy at least a closed position (FIGS. 1 and 4) and an open position (FIGS. 2 and 3). The passage from the closed position to the open position, and conversely, is shown, symbolically, by the double arrow F0 (FIG. 2).

It will be noted that the open position can correspond to a multitude of inclinations of the cover 10, apart from the one associated with the closed position (in which the cover has an angle of 90° with the direction x).

By means of a hinge (not shown in the figures) positioned along the left-hand part of the cover 10 on a portion of its length L, the cover 10 is maintained integral with the rest of the box B. It will be understood that, in a variant, the cover can be removable.

The cover 10B is defined by a first extension 10B.a which extends laterally along the y axis (when the cover 10 occupies the closed position) and a second extension 10B.b extending in depth along the x axis (in the closed position). The angle defined between the first and second extensions is a right angle, or noticeably. Hence, as shown in FIGS. 2 and 3, the cover 10B features a profile (defined according to the direction of viewing z) having the shape of an L.

The upper edges of the first and second extensions 10B.a and 10B.b are connected together by an upper linking wall 10B.c. Likewise, a lower linking wall 10B.d connects the lower edges of the first and second extensions 10B.a and 10B.b.

Further, as shown in FIGS. 2 and 3, in each of the upper 10B.c and lower 10B.d linking walls a cutout 10B.e is made to allow the passage of one or more cables (the connection cable 4 in the example), when the cover 10 occupies the closed position.

Hence, in the closed position of the cover 10, the cover 10B envelops the connection extremity of the cable 4, once the latter is inserted into the connector 3.

In other words, in the closed position (FIGS. 1 and 4), the cover 10 covers the front face 6 of the box B (and thus the attachment zone 5), by means of the flat wall 10A, and some of the right-hand lateral wall 2A (and more specifically the main connection zone 1A, leaving uncovered the auxiliary connection zone 1B), by means of the cover 10B. A final user of the box B thus has access to all the connectors of the auxiliary connection zone 1B, independently from the position of the cover 10.

Generally, within the scope of the invention, it is preferable that the cover 10B comprises a wall (in the example the second extension 10B.b) that, when the cover 10 occupies the closed position, is arranged in a plane approximately orthogonal to the direction of insertion and/or removal of the connection cable or cables of the main connection zone 1A (in the example the connection cable 4). In this manner, the removal and/or connection of the cable or cables of the corresponding connectors of the main connection zone 4 is not allowed.

Hence, in the example described, in the closed position of the cover 10, the second extension 10B.b of the cover 10B is noticeably parallel to the right-hand lateral wall 2A.

Figure 1:
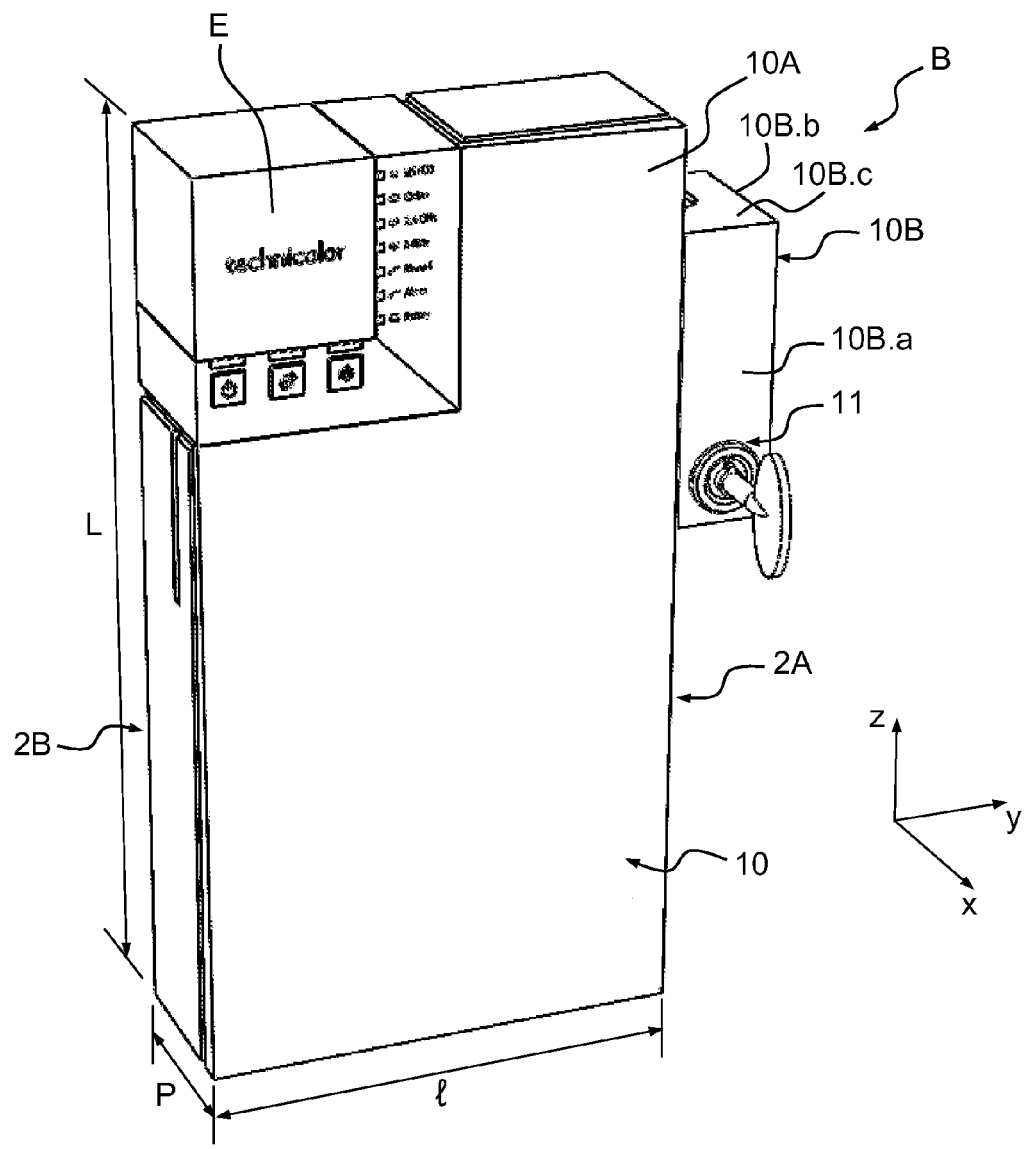
FIG. 1 is a diagrammatic perspective front view of an Internet box in accordance with the present invention, when the moving cover occupies a closed position.

Moreover, as shown in the FIG. 1, the cover 10B is fitted with a key locking system 11 enabling, in a locked position, the cover 10 to be maintained in the closed position. In other words, once the locking system 11 is in locked position and the cover 10 in the closed position, the passage of the latter from the closed position to the open position remains impossible. Naturally, any other type of locking system could be envisaged, for example by code.

Hence, the result of the preceding description is that, in the closed position (FIG. 1), the attachment 5 and main connection 1A zones are simultaneously covered to prevent any access respectively to the screws 7 as well as to the connection cable 4 for an unauthorised person (for example a final user). Naturally, it will be understood that the screws can be replaced by hooks, nails, rivets, etc.

However, when the cover 10 is in open position (FIGS. 2 and 3), the connection 1A and attachment 5 zones can each be accessed by an operator and/or a final user.

Moreover, a rectangular cutout 10C, made in the upper right-hand part of the flat wall 10A of the cover 10, enables a multifunction command screen E of the Internet B to be left uncovered in order to make it accessible from the exterior, irrespective of the position (closed or open) occupied by the cover 10.

Moreover, the flat wall 10A comprises a peripheral edge 10A.a designed to serve as a barrier to dust to prevent, or at least reduce, the soiling of the Internal box B. The peripheral edge 10A.a extends in a direction orthogonal to the plane of the flat wall 10A.

Moreover, as shown in FIG. 3, the Internet box B comprises a slot 12, made at the level of the lower lateral wall 2C and extending in a plane parallel to the latter. The slot 12 can have a dust filter 13 that reduces, or even prevents, dust from entering the box B attracted to the latter by internal cooling elements (not shown). The lower lateral wall 2C comprises vent holes 14, to enable the ventilated air to circulate from the inside of the box B to the outside and conversely. The double arrow F1 (FIG. 3) shows, symbolically, the direction of insertion and extraction of the filter 13 of the slot 12.

It will also be noted that one or more housings can be arranged in the box B, in its lower part. In the example illustrated (see FIG. 3), two housings 15 open in the lower lateral wall 2C. They enable the insertion, in the box B, respectively of a hard disk 16 and a CABLECARD card (registered trademark) 17. The double arrow F1 (FIG. 3) shows, symbolically, the direction of insertion and extraction of the hard disk 16 and the card 17.

Hence, once the hard disk 16 and the card 17 are inserted into the corresponding housings 15, the dust filter 13 can be inserted into the associated slot 12. In this manner, as soon as the cover 10 is in the locked closed position, the extraction of the hard disk 16 and the card 17 is no longer allowed. In other words, only an external operator, who has the key controlling the locking and unlocking of the system 11, is capable of extracting the hard disk 16 and the card 17, after first removing the filter 13 from the slot 12 (the cover 10 occupying the open position).

Naturally, it will be understood that other housings (for example to hold a battery) can be designed in the box B, notably on other walls.

Moreover, as shown in FIG. 5, the box B comprises a removable cable guide 18 designed to orient the cables connected to the main 1A and auxiliary 1B connection zones along the direction z, along the right-hand lateral wall 2A.

The cable guide 18 is formed by a front wall 18A that extends, when fitted to the box B, in a plane defined by the directions y and z, by a lateral wall 18B extending in a plane defined by the directions x and z, as well as by two upper and lower extremity walls 18C, each belonging to a plane defined by the directions x and y.

An opening 18C.a is made in each of the extremity walls 18C (only one is shown in FIG. 5) to enable the longitudinal exit for cables crossing the guide 18.

Each of these openings 18C.a can comprise dust protection means, for example in the form of a row of hairs (or even flexible lips), in order to prevent, or at least limit, the introduction of dust within the cable guide 18 (and thus in the connectors of the main 1A and auxiliary 1B connection zones).

It will be noted that the cable guide 18 can be fitted to the box B by means of a slider system (not shown in FIG. 5) defined according to the direction x.

Moreover, a housing 19 (FIGS. 2 and 5) can be arranged in the rear wall 8 of the box B, in such a manner as to receive a part (preferably rolled) of the connection cable 4 and, possibly, of one or more other cables. This housing is closed by attachment of the box B to the wall 9.

From the preceding description, it will be understood that the moving cover could, in a variant, comprise a flat wall solely designed to cover the attachment zone of the front face, and no longer the latter completely. In other words, in this case, the flat wall of the cover would be in the shape of a strip.

Naturally, it is easy to understand that the present invention is in no way limited to the above-described embodiment.

The invention claimed is:

1. An electronic box comprising:
   a housing;
   a main connection zone defined on one wall of the housing and including at least one main connector configured to receive an external connection cable;
   an attachment zone separate from the main connection zone and defined on another wall of said housing for attaching the box to an external support, and
   a cover permanently connected to said housing and moving in relation to the housing between a closed position in which the main connection zone and the attachment zone are simultaneously covered to prevent access to said attachment zone and said external connection cable and an open position providing access to the main connection zone and the attachment zone.

2. The electronic box according to claim 1, further comprising an auxiliary connection zone separate from the main connection zone and defined on the same wall of the housing as the main connection zone, said auxiliary connection zone remaining accessible irrespective of the position occupied by said cover.

3. The electronic box according to claim 2, wherein said main connection zone is positioned adjacent said auxiliary connection zone.

4. The electronic box according to claim 1, wherein said cover comprises: a first wall configured to cover, in the closed position, the attachment zone, and a second wall integral with said first wall configured to cover, in the closed position, the main connection zone.

5. The electronic box according to claim 4, wherein said second wall includes a side arranged in a noticeably orthogonal manner to a direction of insertion of the external connection cable into the main connector, when the cover occupies the closed position, preventing disconnection of said cable.

6. The electronic box according to claim 4, wherein said second wall comprises a locking system enabling the cover to be maintained in the closed position, once said locking system is locked.

7. The electronic box according to claim 1, wherein the housing includes at least one main housing for receiving a removable main module when said cover occupies the open position, said main module being maintained inside said main housing by said cover in the closed position.

8. The electronic box according to claim 7, wherein the housing further includes at least one auxiliary housing for receiving a removable auxiliary module when said cover occupies the open position, said auxiliary module being maintained inside said auxiliary housing by said cover when said moving part occupies the closed position.

9. The electronic box according to claim 1, further comprising a removable guide for orienting a t least one external connection cable along a wall of said box.

10. The electronic box according to claim 1, further comprising a cable housing for at least partially receiving at least one external connection cable.

11. The electronic box according to claim 1, wherein said electronic box is an access box for at least one of Internet and video decoding.

* * * * *